United States Patent [19]
Burke et al.

[11] 3,836,773
[45] Sept. 17, 1974

[54] DEVICES FOR SENSING RADIATION

[75] Inventors: Hubert K. Burke, Scotia; Gerald J. Michon, Waterford, both of N.Y.

[73] Assignee: General Electric Company, Schenectady, N.Y.

[22] Filed: Apr. 30, 1973

[21] Appl. No.: 355,571

[52] U.S. Cl. .......... 250/211 J, 317/235 N
[51] Int. Cl. .......... H01j 39/12
[58] Field of Search .......... 178/6, 6.6; 340/166 R, 340/173 LS, 173 LT; 250/211 R, 211 J, 220 M; 317/235 N

[56] References Cited

UNITED STATES PATENTS

| | | | |
|---|---|---|---|
| 3,448,344 | 6/1969 | Schuster | 317/235 N |
| 3,500,448 | 10/1965 | Forlani | 250/211 J |
| 3,551,761 | 12/1970 | Ruoff | 340/173 LS |
| 3,569,704 | 3/1971 | Mitchell | 317/235 N |
| 3,660,667 | 5/1972 | Weimer | 250/211 J |
| 3,665,190 | 5/1972 | Kotera | 250/211 J |
| 3,676,715 | 7/1972 | Brojdo | 340/173 LS |
| 3,703,669 | 11/1972 | London | 317/235 N |
| 3,737,742 | 6/1973 | Breuer | 317/234 N |

*Primary Examiner*—James W. Lawrence
*Assistant Examiner*—D. C. Nelms
*Attorney, Agent, or Firm*—Julius J. Zaskalicky; Joseph T. Cohen; Jerome C. Squillaro

[57] ABSTRACT

In an array of radiation sensitive devices each including a pair of closely coupled conductor-insulator-semiconductor cells on a common substrate of one conductivity type, stored charge is repeatedly transferred from one cell of the pair to the other cell of the pair before being injected into the substrate and an electrical signal developed thereby. In order to minimize charge loss to the substrate and noise ultimately produced in the electrical signal due to the repeatedly incomplete transfer of charge between the cells of a pair, a region of opposite conductivity type is provided in the substrate substantially surrounding the semiconductor portions of the capacitor cells and contiguous therewith.

10 Claims, 10 Drawing Figures

DEVICES FOR SENSING RADIATION

The present invention relates in general to devices for sensing radiation. The present invention relates in particular to devices for use in apparatus which senses and stores charge produced by electromagnetic radiation flux and which provides an electrical readout of the stored charge.

This application relates to improvements in the devices and apparatus of copending U.S. Pat. application Ser. No. 264,804 filed June 21, 1972 and assigned to the assignee of the present application, which application is incorporated herein by reference.

The radiation sensing apparatus disclosed in the aforementioned patent application comprises a substrate of semiconductor material of one conductivity type having a plurality of storage sites arranged in a plurality of rows and columns for storage of radiation generated minority carriers therein. Each of the storage sites includes a row oriented conductor-insulator-semiconductor capacitive cell and a closely coupled column oriented conductor-insulator-semiconductor capacitive cell. Each of the row-oriented conducting members or plates of a row of sites are connected to a respective row conductor line. Each of the column-oriented conducting members or plates of a column of sites are connected to a respective column conductor line. Switching means are provided for periodically connecting and disconnecting the substrate from ground or point of reference potential. Means are provided for charging the row and column conductor lines to predetermined potentials in relation to the potential of the point of reference potential to establish depletion regions in the substrate underlying each of the first and second conductive plates with the depletion regions underlying adjacent first and second conductive plates being coupled. Selective read out of charge stored in a row of sites is accomplished by changing the potential on the row line to cause flow of charge stored in the row-oriented storage cells thereof into the column-oriented storage cells thereof. The read out of charge stored in column-oriented cells is accomplished by changing the potential on each of the column lines in sequence to cause injection of carriers stored therein into the substrate in sequence and concurrently disconnecting the substrate from ground or reference potential during each such injection of carriers. Each such injection produces a respective current flow in circuit with the substrate which is sensed across an integrating capacitance which includes the inherent capacitance of the conductor lines and conducting members connected thereto in relation to the substrate. Means are provided for periodically sampling the variation in voltage developed on the integrating capacitance to provide an electrical output varying in time in accordance with the variation in amplitude of the samples.

Over a frame of scan of the array the charge stored in each pair of closely coupled cells is repeatedly transferred between the column-oriented cell and the row-oriented cell thereof prior to injection into the substrate. Such repeated transfers particularly if done at high scanning rates causes some charge to be lost in the substrate. Such incomplete transfer of charge between closely coupled cells introduces a component of noise in the video signal ultimately derived from injection of the stored charge into the substrate.

The present invention is directed to overcoming problems such as outlined above in radiation responsive apparatus.

Accordingly, an object of the present invention is to provide an improved radiation sensing device of the kind described above.

Another object of the present invention is to provide arrays of radiation sensing elements of the kind described above which include very large numbers of sensing elements with minimum degradation of the output signal therefrom.

A further object of the present invention is to provide arrays of radiation sensing elements of the kind described above which can be operated at higher read out speeds with minimal increase in background noise level attendant thereon.

In accordance with the present invention to minimize charge loss to the substrate due to repeated transfers of signal charge between cells of a closely coupled pair of cells and to minimize the noise component ultimately produced in the electrical signal due to such incomplete transfer of signal charge, there is provided a region of opposite conductivity type in the substrate of one conductivity type which substantially surrounds the semiconductor portions of the capacitor cells and is contiguous therewith.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

Figure 1A:
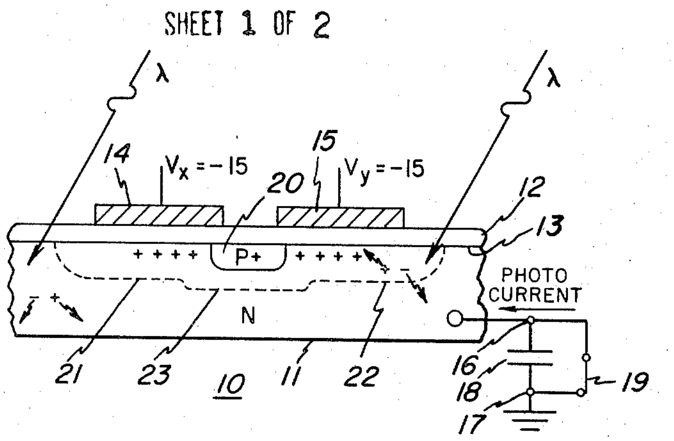
FIGS. 1A–1C show diagrams of pairs of conductor-insulator-semiconductor cells of the kind incorporated in the radiation sensing array of FIG. 3, illustrating various stages of operation thereof.
Figure 1B:
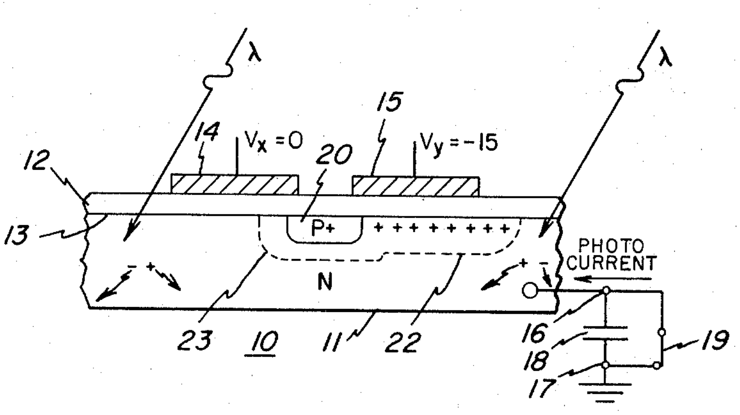
Figure 1C:
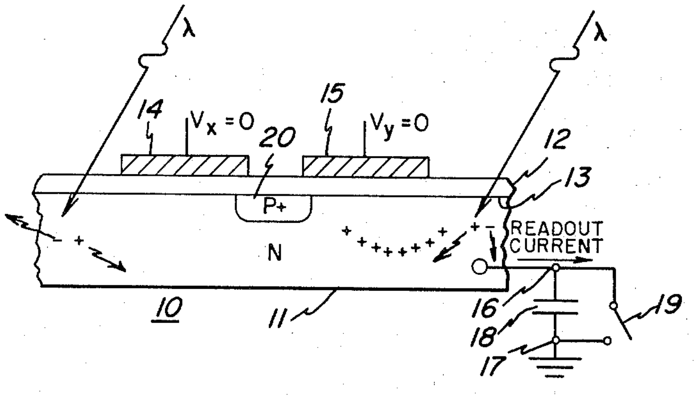

Reference is now made to FIGS. 1A, 1B and 1C which show a pair of coupled sensing cells particularly suitable for operation in two dimensional arrays. FIG. 1A shows a device 10 including a substrate 11 of N-type conductivity semiconductor material, an insulating member 12 overlying the major surface 13 of the substrate, and the pair of conductive members or plates 14 and 15 overlying the insulating member. Plate 14 is adapted to be connected to a row conductor line of an array consisting of rows and columns of radiation sensing devices. Plate 15 is adapted to be connected to a column conductor line of the array. Integrating capacitor 18 is connected between the substrate terminal 16 and ground terminal 17. This capacitor represents the capacitance of the plate 14 with respect to the substrate as well as intentionally added capacitance. A reset switch 19 is connected across terminals 16 and 17. Plates 14 and 15 are closely spaced and the substrate underlying the space between the plates is provided with a P-type conductivity region 20. The plate 14 and plate 15 are connected to operating potential points on a source (not shown) of operating voltage to provide the indicated negative potentials with respect to ground, i.e., $V_x = -15$ volts and $V_y = -15$ volts. The connection to column oriented plate 15, the ground terminal 17, and the substrate terminal 16 are referred to respectively as first, second and third terminals, and, in addition, the connection to the row oriented plate 14 is referred to as the fourth terminal. The storage potentials applied to the column oriented plate 15 and to the row oriented plate 14 are referred to, respectively, as first and fourth potentials. The reference or ground potential is referred to as the second potential. The injection potential for the column oriented plate 15 is referred to as the third potential.

When potentials of appropriate polarity with respect to the substrate and appropriate magnitude, for example the −15 volts indicated in FIG. 1A, are applied to the plates 14 and 15, a pair of depletion regions 21 and 22 are formed which are connected together by the high conductivity P-type region 20 which also has a depletion region 23 associated with it. Accordingly, charge stored in one of the depletion regions under either of the plates 14 and 15 may readily flow to the other depletion region through the P-type conductivity region 20. Radiation flux entering the depletion regions causes the generation of minority carriers which are stored at the surface of the depletion regions. This condition is indicated by current flow into the substrate as charge accumulates in the surface portion of the depletion regions and corresponds to conduction of electron charge in the external potential applying circuits between the plates and the substrate. FIG. 1B shows the condition of the device when the voltage on plate 14 is set at zero to collapse the depletion region 21 thereof and cause the charge that was stored therein to flow or transfer into the inversion layer in region 22 underlying the plate 15. To read out or sense the charge that has been stored in the inversion layer, potential on the plate 15 is collapsed or reduced in magnitude to a suitable value, such as zero, after the reset switch 19 connected across the integrating capacitor 18 has been opened. Such action causes the carriers stored in the inversion layer to be injected into and produce a current flow out of the substrate corresponding to the charge stored in the depletion region 22 and injected into the substrate.

The increase in potential of the plate 15 from a negative value to a zero value causes a reduction in the electric field that maintained the charge in the surface inversion layer and causes the minority carriers stored in the inversion layer to be injected into the substrate. The injection of minority carriers is indicated by the distribution of positive charge throughout the substrate 11. Such injection causes a neutralizing negative charge to flow into the substrate, i.e., a conventional current to flow out of the substrate. Such current flows from the substrate 11 into the capacitor 18 which becomes charged to a value dependent on the injected charge. The minority carriers injected into the substrate eventually diffuse away from the region into which they were injected or recombine therein. Reestablishment of the depletion region for another cycle of operation should await disappearance of such minority carriers from the region 22, otherwise the stored charge would be reaccumulated or recollected or reestablished of depletion in the region 22. The potential on plate 15 is returned to its original value prior to closing of the reset switch 19 and subsequent to the time during which the injected minority carriers have disappeared from the region 22. In this mode of operation the current flow into the substrate subtracts from the current flow out of the substrate. The depletion region component of current flow out of the substrate, identified as due to remaining depletion charge, is very nearly equal to the current flow into the substrate which initially established the depletion region, referred to as depletion region charging current.

Samples may be taken of the voltage on the integrating capacitor resulting from successive cycles of operation of the cell to provide a video signal which represents the integrated value of radiation falling on the cell in successive cycles of operation. Thus, spurious signals produced in the video output due to the drive voltages applied to the cell are largely eliminated. In the case of an array, charge contained in the stray capacitance of the conductors connected to the plates of the device being read out is also included in current flowing into the integrating capacitance. This component of current can be quite large in relation to the current flow in response to injection of the charge. However, as this component of current is not affected by storage of charge in the device, it is completely cancelled by reestablishment of storage potential on the device. Also, in arrays, variations in the cell capacitances are eliminated as long as the first and third potential levels do not vary in the scanning of the array. While in the example the third potential applied to the plate 14 was ground or identical to the second potential, it should be readily apparent that the third potential could be any potential between the first and second potentials.

Figure 2A:
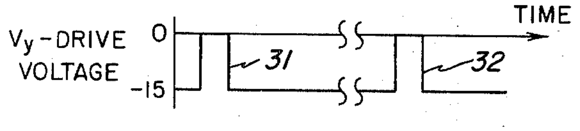
FIGS. 2A–2C are graphs of various voltage and current signals appearing in the diagrams of FIGS. 1A–1C useful in explaining the operation thereof.
Figure 2B:
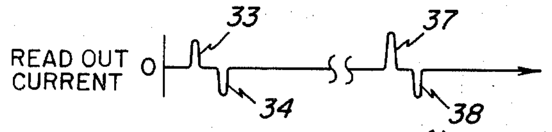
Figure 2C:
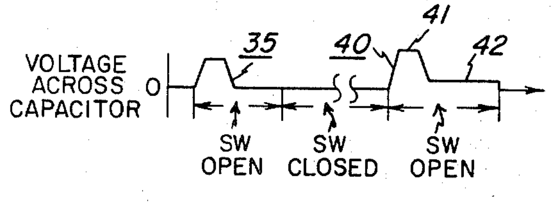

Reference is now made to FIGS. 2A, 2B and 2C which show, respectively, graphs of column oriented plate drive voltage $V_y$, read out current, and integrating capacitor voltage drawn to a common time scale for the device shown in FIGS. 1A, 1B and 1C for two different conditions of charge storage in the cells, one in which no radiation produced charge has been stored and the other in which charge has been stored in response to radiation. It is assumed that the voltage $V_x$ of the row oriented plate has been reduced to zero. FIG. 2A shows identical pulses 31 and 32 of drive voltage applied to the plate 15 in different cycles of operation. FIG. 2B shows the currents which flow through the substrate connection in response to the application of such pulses. FIG. 2C shows the voltage developed across the capacitor 18 due to the current flow shown in FIG. 2B. FIG. 2C also shows the periods of time during which the reset switch 19 is open and periods of time during which it is closed. The first pair of current pulses 33 and 34 shown in FIG. 2B represent a condition in which no radiation has been received and hence no charge stored in the column oriented cell of the device 10. During the change of voltage from a minus fifteen volt level to ground level, the charge used to establish the depletion region 22 flows out and appears as the positive going pulse 33. After the read out period the voltage on the plate is returned to its minus fifteen volt level and produces charge flow, represented by a current pulse 34 to establish the initial depletion region under the plate 15 and is equal to the current pulse 33. Accordingly, a voltage pulse 35 is developed across capacitor 18 which is essentially identical in form except for its amplitude to pulse 31. The net voltage output at the end of the integration operation is zero as shown in FIG. 2C.

Attention is now directed to pulses 37 and 38 produced in response to application of pulse 32 to the column oriented cell. The positive pulse 37 of large amplitude represents the charge stored in the depletion region 22 in response to radiation as well as some of the charge which flowed into the substrate as a result of the depletion region capacitance. The negative pulse 38 of small amplitude represents current which flows into the substrate to establish the initial depletion region therein. Integration of pulses 37 and 38 in capacitor 18 produces a pulse 40 of the form shown. Initially, the voltage across the capacitor 18 rises to a large amplitude or level 41 due to the first pulse 37 of current and upon occurrence of the second pulse 38 of current the voltage on the capacitor drops to a second level 42, conveniently referred to as the back porch of the pulse. The second level 42 represents a voltage corresponding to the charge stored in the inversion layer of region 22. Note that the reset switch 19 is open during the sampling interval, i.e., during the occurrence of the voltage pulses of FIG. 2C of each cycle of operation of the sensing device and remains closed during the remainder of the cycle during which storage of charge is occurring in the device in the case of a system with a single device. Successive cycles of operation of the device in circuit would produce successive voltage pulses such as pulse 40, the back porch of which varies in accordance with the radiation incident on the device during the storage period. Sampling the back porch of the successive voltage pulses would provide a signal representing the variation of radiation incident on the device as a function of time.

In the case of an array of such devices the switch 19 which shorts out the integrating capacitance is common to all of the devices of the array and is opened and closed during the readout of each device of the array and accordingly is cycled many times during a storage and readout cycle of a single device of the array. The dielectric capacitance of the cell is preferably large in relation to initial depletion capacitance of the cell to provide a large ratio of storage capability for photon generated charge to spurious current due to charging and discharging of the depletion region. A ratio of dielectric to depletion capacitance of ten to one in each of the cells of a two dimensional array of a large number of cells provides adequate storage capability to represent a large range of radiation intensities while the spurious signal due to the depletion region is small enough that amplifier overloading and consequent loss of cancellation of capacitive signals from the unaccessed cells (half-selected) in a column of the array does not occur. Two ways in which to alter the ratio for given operation potentials is by altering the insulating layer thickness or by altering the resistivity of the substrate.

The integrating capacitance is preferably large in relation to the dielectric capacitance of a cell in order to provide relatively small fluctuations in substrate potential in the cyclical operation of the cell. With larger integrating capacitance, the voltage variation thereon in response to signal currents from the substrate are correspondingly smaller, i.e., the signal to noise ratio of the sampled signal decreases. With smaller integrating capacitance the variation in substrate potential becomes larger and correspondingly less charge is injected into the substrate for a given difference between storage potential and injection potential on the plate of the cell, or expressed in other words a greater such difference in potential is required to obtain full injection of stored charge.

Figure 3:
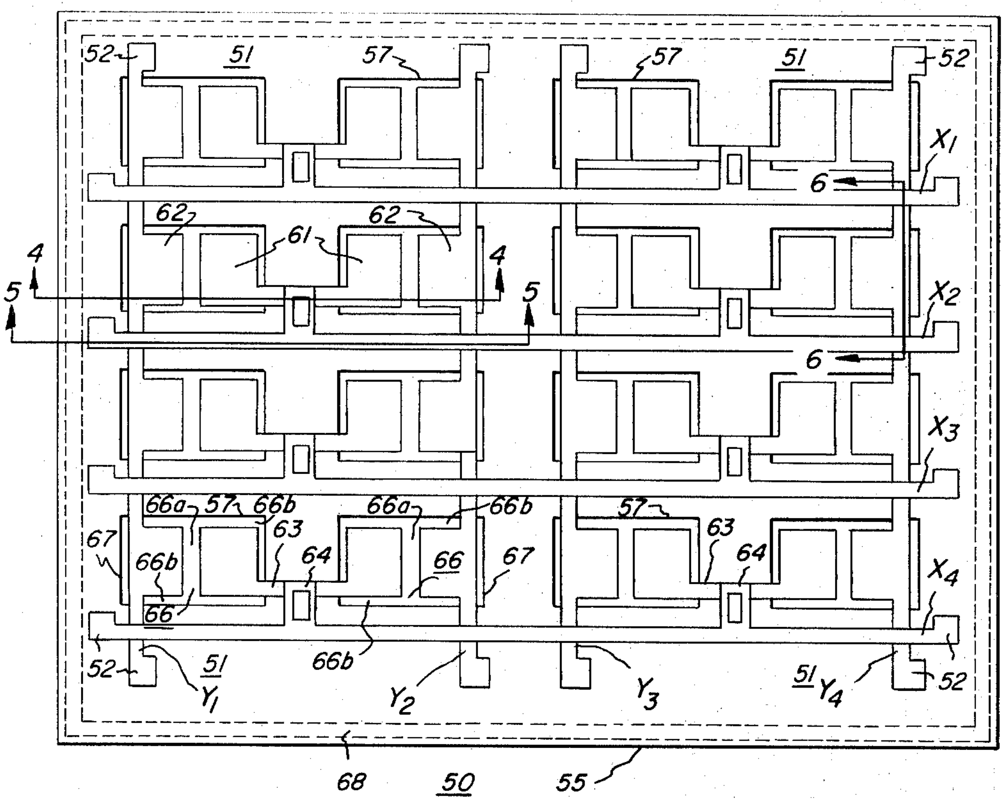
FIG. 3 is a plan view of an array or assembly of a plurality of radiation responsive devices such as shown in FIGS. 1A–1C formed on a common semiconductor substrate.
Figure 4:
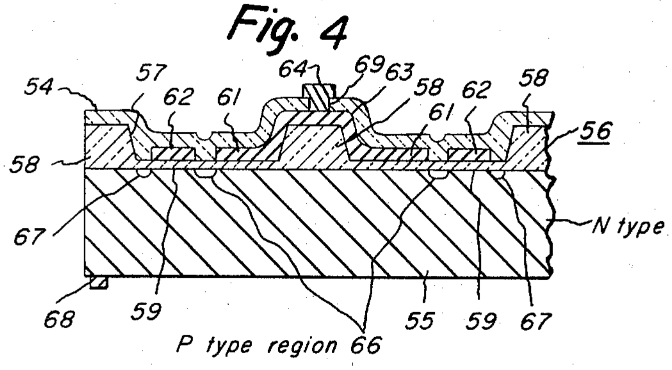
FIG. 4 is a sectional view of the assembly of FIG. 3 taken along section lines 4—4 of FIG. 3.
Figure 5:
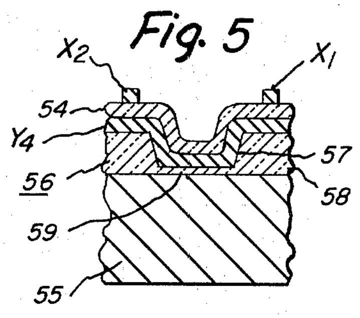
FIG. 5 is a sectional view of the assembly of FIG. 3 taken along section lines 5—5 of FIG. 3.
Figure 6:
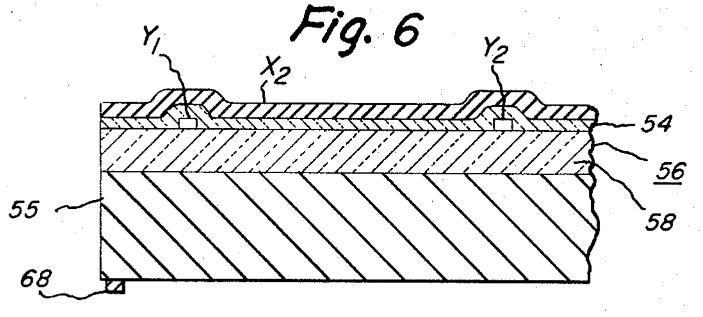
FIG. 6 is a sectional view of the assembly of FIG. 3 taken along section lines 6—6 of FIG. 3.

Reference is now made to FIGS. 3, 4, 5 and 6 which show an image sensing array 50 of radiation sensing devices 51, such as device 10 described in FIGS. 1A, 1B and 1C, arranged in four rows and columns. The array includes four row conductor lines, each connecting the row-oriented plates of a respective row of devices, and are designated from top to bottom $X_1$, $X_2$, $X_3$ and $X_4$. The array also includes four column conductor lines, each connecting the column-oriented plates of a respective column of devices, and are designated from left to right $Y_1$, $Y_2$, $Y_3$ and $Y_4$. Conductive connections are made to lines through conductive landings or contact tabs 52 provided at each end of each of the lines. While in FIG. 3 the row conductor lines appear to cross the column conductor lines, the row conductor lines are insulated from the column lines by a layer 54 of transparent glass as is readily apparent in FIGS. 4, 5 and 6. In FIG. 3, the outline of the structure underlying the glass layer 54 is shown in solid outline for reasons of clarity.

The array includes a substrate or wafer 55 of semiconductor material of N-type conductivity over which is provided an insulating layer 56 contacting a major face of the substrate 55. A plurality of deep recesses 57 are provided in the insulating layer, each for a respective device 51. Accordingly, the insulating layer 56 is provided with thick or ridge portion 58 surrounding a plurality of thin portions 59 in the bottom of the recesses. On the bottom or base of each recess are situated a pair of substantially identical conductive plates or conductive members 61 and 62 of rectangular outline. Plate 61 is denoted a row-oriented plate and plate 62 is denoted a column oriented plate. The plates 61 and 62 of a device 51 are spaced close to one another along the direction of a row and with adjacent edges substantially parallel. In proceeding from the left hand portion of the array to the right hand portion, the row-oriented plates 61 alternate in lateral position with respect to the column oriented plates 62. Accordingly, the row-oriented plates 61 of pairs of adjacent devices of a row are adjacent and are connected together by a conductor 63 formed integral with the formation of the plates 61. With such an arrangement a single connection 64 from a row conductor line through a hole 69 in the aforementioned glass layer 54 is made to the conductor 63 connecting a pair of row-oriented plates. The column-oriented conductor lines are formed integrally with the formation of the columnoriented plates 62. A P-type conductivity region 66 of high conductivity or low impedance is provided in the surface adjacent ergion of the substrate underlying the base of the recess 57. The P-type conductivity region includes a part 66*a* contiguous to the adjacent edges of the portions of the surface adjacent region underlying the plates 61 and 62 and also includes a part 66*b* contiguous to a substantial part of the other edges of the surface adjacent portions of the substrate underlying the plates 61 and 62. In the case of the surface adjacent portion underlying plate 61, part 66*b* completely touches the two remote sides and substantially all of the third remote side thereof. In the case of the surface adjacent portion underlying plate 62, part 66*b* completely touches the two remote sides thereof. Region 67 in the substrate is also of P-type conductivity and is formed concurrently with the formation of P-type region 66 in accordance with the diffusion technique for the formation thereof in which the plates 61 and 62 and thick oxide 58 mask diffusion of the P-type dopant into the substrate and set the lateral boundaries of the diffusion. P-type region 67 is separated from P-type region 66 by the fabrication process utilized. If needed, the P-type region 67 could be made integral with P-type region 66 and a P-type region could be provided under conductor 63 so that the P-type region completely surrounds and is in continuous contact with all of the edges of the surface adjacent portions underlying the plates 61 and 62. The glass layer 54 ovelies the thick portion 58 and thin portion 59 of the insulating layer 56 and the plates 61 and 62, conductors 63 and column-oriented conductor lines $Y_1$–$Y_4$ thereof except for the contact tabs 52 thereof. The glass layer 54 may contain an acceptor activator and may be utilized as an acceptor diffusion source in the formation of the ptype regions 66 and 67. A ring shaped electrode 68 is provided on the major surface of the substrate opposite the major surface on which the devices 51 were formed. Such a connection to the substrate permits rear face as well as front face interception of radiation from an object to be sensed.

The image sensing array 50 and the devices 51 of which they are comprised may be fabricated using a variety of materials and in variety of sizes in accordance with established techniques for fabricating integrated circuits. One example of an array using specific materials and specific dimensions will be described. The semiconductor material is a wafer of monocrystalline silicon of N-type conductivity, of 4 ohm-cm resistivity, and 10 mils thick. The insulating layer is thermally grown silicon dioxide with the thin portions 59 of 0.1 micron thereof underlying the plates separately grown after etching of an initially uniformly thick layer of 1 micron of thermally grown silicon dioxide to form the recesses 57 therein. The row-oriented rectangular plates 61 and the column-oriented plates 62 are made of vapor deposited molybdenum. The plates are 1.2 mils by 0.9 mils and adajcent edges are spaced apart by 0.2 mil. The connections 63 between adjacent row-oriented plates of adjacent devices of a row and the column conductor lines $Y_1$–$Y_4$ are also of molybdenum and are integrally formed with the formation of row-oriented plates 61 and column-oriented plates 62. The insulating layer 54 is a borosilicate glass which is vapor deposited over the plates 61 and 62 and the conductors thereof. As will be explained below the P-type region in the substrate is formed by diffusion from the borosilicate glass layer 54 through the thin portion 59 of silicon oxide layer 56. The borosilicate glass getters heavy metal ions in the substrate which improves the quality of the substrate semiconductor material and reduces leakage of minority charge into the storage cells. The row-oriented conductor lines $X_1$–$X_4$ are constituted of vapor deposited aluminum overlying the insulating layer 54. Openings 69 in the insulating layer 54 over the conductors 63 interconnecting adjacent row-oriented plates 61 of adjacent devices of a row enable connections 64 to be made therethrough so that all the row-oriented plates of a row are connected to the row conductor line of that row. The ring electrode 68 forms an ohmic contact with the substrate.

Starting with the N-type silicon wafer 55 a thick layer of field oxide 56 is thermally grown thereon. Recesses extending to surface of the silicon wafer are formed in the oxide layer 56 using conventional photolithographic techniques and thereafter the thin portions 59 of the layer are thermally grown to the desired extent to form the bases of the recesses 57. A layer of molybdenum 0.4 micron thick is vapor deposited over the exposed portions of the insulating layer. The molybdenum layer is patterned using conventional photolithographic techniques to form the plates 61 and 62, the conductors 63, and the column-oriented lines $Y_1$–$Y_4$. Next, a low temperature borosilicate glass is deposited over the wafer to form the insulating layer 54. The wafer 55 is heated to drive boron from the layer 84 through the thin portions 59 of layer 56 in the bases of the recesses 57 that are not masked by the molybdenum conductors and into the silicon substrate to form the P-type conductivity regions 66 and 67 therein. The insulating layer 54 is patterned with holes 69 extending to the conductors 93 and thereafter a layer of aluminum 1 micron thick is deposited by evaporation over the surface of the insulating layer 54. The layer of aluminum extends into the holes 69 and makes connection with the conductors 63. The layer of aluminum is patterned to provide the row-oriented conductor lines $X_1$–$X_4$.

In the operation of the array assembly of FIGS. 3–6, which is set forth in detail in the aforementioned patent application Ser. No. 264,804, an integrating capacitance such as capacitance 18 of FIGS. 1A–1C is provided between substrate electrode 68 and ground. Operating potentials to produce depletion regions in the substrate are applied between the row lines $X_1$–$X_4$ and ground, and between the column lines $Y_1$–$Y_4$ and ground. In sequence each of the row lines are collapsed in potential to cause transfer of charge from the row oriented plates to the column oriented plates of the row. In sequence the column oriented plates of the row are collapsed in potential for a short period to cause injection of charge into the substrate and then potential is reestablished as explained in connection with FIGS. 2A–2C. The charge injected at each site in the row is sensed or measured in sequence. After scan of one row the potential on that row line is returned to its storage value and the next row of sites is sensed in the same way. The injected charge periodically sampled at the integrating capacitance 18 provides a video signal of the radiation striking the array of devices. In a complete or frame scan of the devices of the array, the stored charge in the rows of closely coupled cells (except the row being addressed) is repeatedly transferred from a column-oriented cell to a row-oriented cell and back again prior to injection into the substrate. Such repeated transfers particularly if done at high scanning rates causes some charge to remain behind and be lost to the substrate. Such incomplete transfer of charge between the closely coupled cells of a pair introduce a component of noise in the resultant derived video signal.

In accordance with the present invention providing coupling in the form of a P-type region in the substrate substantially surrounding the semiconductor portions of the cells and contiguous with a substantial part of the edges of the semiconductor portions other than the adjacent edges reduces the charge flow path or effective channel length between adjacent closely coupled cells. Reduction of the charge flow path reduces loss of charge to the substrate during the repeated transfer of charge between adjacent cells and also reduces the time required for substantially complete transfer of charge between adjacent cells. Accordingly, such a structure increases the rate at which the device may be scanned and reduces the noise component in the signal produced by the repeated transfer of charge.

Also, as pointed out above, diffusion from glass oxides of the activator or dopant getters extraneous metal impurities in the substrate thereby reducing the leakage of minority charge into the capacitor elements or cells and hence further reducing the noise component of the sampled signal.

While in the illustrative embodiment of FIGS. 3–6 the P-type region 66 was shown as partially surrounding the surface adjacent portions of the capacitor cells of a device, it is readily apparent that with appropriate changes in the device fabrication process the P-type region can be made to completely surround the surface adjacent portions.

While in the illustrative embodiments described, the semiconductor substrate is constituted of silicon semiconductor material, other semiconductor materials such as germanium and Group III-Group V compounds, such as indium arsenide and indium antimonide, could be used. Also, while in the illustrative embodiments described the insulating member was constituted of silicon dioxide, other insulating materials such as silicon nitride, silicon oxynitride, and aluminum oxide would be suitable. Also, the conductive plates could be constituted of any of a number of conductive materials, metallic and non-metallic.

While the array of the embodiment of FIGS. 3–6 described as constituted of an N-type conductivity semiconductor material, P-type conductivity semiconductor material could as well be used.

In front face illumination of the array of FIGS. 3–6, the conductive plates are preferably transparent to provide high efficiency and sensitivity. Transparency in the conductive plates may be obtained by use of transparent metal layers or transparent high conductivity semiconductor materials, such as heavily doped silicon, or other materials which are both conductive and transparent, particularly in thin layers.

While the invention has been described in connection with arrays of 16 devices, it is readily apparent that arrays including devices many orders of magnitude greater than 16 in number can be constructed in accordance with the invention. Also, the devices of the array may be organized in arrangements other than shown.

While the invention has been described in specific embodiments, it will be appreciated that modifications, such as those described above, may be made by those skilled in the art and it is intended by the appended claims to cover all such modifications and changes as fall within the true spirit and scope of the invention.

What we claim as new and desire to secure by Letters Patent of the United States is:

1. A radiation sensing device comprising a substrate of semiconductor material of one conductivity type having a major surface, a first conducting member overlying and in insulated relationship to a first surface portion of said substrate adjacent said major surface, a second conducting member overlying and in insulated relationship to a second surface portion of said substrate adjacent said major surface, said second surface adjacent portion being closely spaced to said first surface portion, means for coupling said first and second surface portions including a surface region of opposite conductivity type in said substrate adjacent said major surface thereof and contiguous to the adjacent edges of said first and second surface portions.

2. The device of claim 1 in which said conducting members are of rectilinear outline.

3. The device of claim 1 in which said conducting members are metallic.

4. The device of claim 1 in which said semiconductor material is silicon and said conducting members are polycrystalline silicon.

5. The device of claim 1 in which said substrate is of N-type conductivity and said region of opposite conductivity type is of P-type conductivity.

6. The device of claim 1 in which said surface region of opposite conductivity type is contiguous to a substantial part of the other edges of each of said first and second surface portions.

7. An array of radiation sensing devices comprising a substrate of semiconductor material of one conductivity type having a major surface, a plurality of first conductive plates, each overlying and in insulated relationship to said major surface and forming a first conductor-insulator-semiconductor capacitor with said substrate, a plurality of second conductive plates, each adjacent a respective first conductive plate to form a plurality of pairs of plates, said pairs of plates being arranged in a matrix of rows and columns, each of said second conductive plates overlying and in insulated relationship to said major surface and forming a second conductor-insulator-semiconductor capacitor with said substrate, means for coupling each pair of adjacent first and second capacitors including a respective surface region of opposite conductivity type in said surface regions of opposite conductivity type being contiguous to the adjacent edges of a pair of surface portions of said substrate underlying a respective pair of first and second plates and also contiguous to a substantial part of the other edges of said pair of surface portions of said substrate, a plurality of column conductor lines, the first conductive plates in each of said columns connected to a respective column conductor line, a plurality of row conductor lines, the second conductive plates in each of said rows connected to a respective row conductor line.

8. The array of claim 7 in which each of said regions of opposite conductivity type completely surrounds a respective pair of surface portions underlying said plates in a plane parallel to said major surface.

9. The array of claim 7 in which a layer of insulating material is provided having a surface in contact with said major surface of said substrate and an opposed surface having a plurality of recesses, said recesses being arranged in a matrix of rows and columns, each pair of adjacent first and second plates located in the base of a respective recess.

10. The array of claim 9 in which the edges of said plates are spaced from the edges of said base, and each of said regions of opposite conductivity type is laterally bounded by the edges of said plates and the edges of said base region.

* * * * *